(12) United States Patent
Qiang et al.

(10) Patent No.: US 8,258,216 B2
(45) Date of Patent: Sep. 4, 2012

(54) THERMOSETTING RESIN COMPOSITIONS AND ARTICLES

(75) Inventors: Wei Qiang, Singapore (SG); Ke Wang, Singapore (SG); Doug Leys, Irvine, CA (US); Greg Almen, Mesa, AZ (US)

(73) Assignee: Park Electrochemical Corporation, Melville, NY (US)

( * ) Notice: Subject to any disclaimer, the term of this patent is extended or adjusted under 35 U.S.C. 154(b) by 19 days.

(21) Appl. No.: 12/870,477

(22) Filed: Aug. 27, 2010

(65) Prior Publication Data

US 2011/0048776 A1    Mar. 3, 2011

Related U.S. Application Data

(60) Provisional application No. 61/238,081, filed on Aug. 28, 2009.

(51) Int. Cl.
*C08K 5/52* (2006.01)
*H05K 1/00* (2006.01)
*B05D 5/12* (2006.01)

(52) U.S. Cl. ........ 524/127; 524/115; 524/415; 524/555; 528/398; 427/99.4; 174/258

(58) Field of Classification Search ............... 524/415, 524/115, 555, 127; 528/398; 427/99.4; 174/258
See application file for complete search history.

(56) References Cited

U.S. PATENT DOCUMENTS

| 6,774,160 B2 | 8/2004 | Yeager |
| 7,193,009 B2 | 3/2007 | Amou |
| 2004/0143045 A1 | 7/2004 | Morgan et al. |
| 2005/0234173 A1 | 10/2005 | Tsuchikawa et al. |
| 2006/0008632 A1 | 1/2006 | Oohori et al. |

OTHER PUBLICATIONS

Written Opinion mailed May 17, 2012, which issued in corresponding International Application Serial No. PCT/US10/46998.

*Primary Examiner* — Duc Truong
(74) *Attorney, Agent, or Firm* — Fish & Richardson P.C.

(57) ABSTRACT

The present invention generally relates to a resin composition, a cured resin, a sheet-like cured resin, a laminated body, a prepreg, electronic parts, single and multilayer circuit boards comprising a cyanate ester polymer and condensed phosphate ester, for use in single and multilayer circuit boards that are especially useful in the high-frequency range of above 100 MHz.

45 Claims, No Drawings

THERMOSETTING RESIN COMPOSITIONS AND ARTICLES

CROSS REFERENCE TO PRIOR APPLICATION

This application claims priority to U.S. Provisional Application Ser. No. 61/238,081 filed on Aug. 28, 2009, which is incorporated herein by reference in its entirety.

FIELD OF THE INVENTION

The present invention generally relates to a resin composition, a cured resin, a sheet-like cured resin, a laminated body, a prepreg, electronic parts, single and multilayer circuit boards comprising a cyanate ester polymer and condensed phosphate ester, for use in single and multilayer circuit boards that are especially useful in the high-frequency range of above 100 MHz.

BACKGROUND OF THE INVENTION

Recent progress in devices utilizing radio waves, such as mobile phones, wireless LAN (Local Area Network), GPS (Global Positioning System), and automotive radar has been prolific. With the significant increase in the volume of information transmitted, telecommunication signals are requiring higher frequencies, and telecommunication devices are being downsized. Thus, there is now a strong demand for RF devices having smaller and more lightweight electronic components which transmit information at high speeds.

State-of-the-art telecommunication devices use high-speed microprocessors working at operating frequencies exceeding 500 MHz, typically from 1-10 GHz, and corresponding signal frequencies have been increasing rapidly in order to process a larger volume of information in a shorter time. One of the problems with devices handling high-speed pulse signals is delay on the printed circuit board. In general, printed circuit boards comprise an electrically insulating dielectric substrate upon which is disposed a layer of a metal. The metal can be laminated, glued, sputtered, or plated on to the printed circuit boards' substrate. As signal delay time increases in proportion to the square root of the dielectric constant of the circuit board, the choice of this dielectric substrate can have a significant impact on processing and transmission speed.

Printed-circuit boards also dissipate electromagnetic energy during signal transmission, and this effect is magnified at the higher frequencies required in modern wireless and broadband applications. This transmission results in energy loss from the electronic component in the form of heat, which can further compromise the speed and efficiency of the device.

Two properties that play a significant role in high-speed circuit design are the dielectric constant (Dk) and dissipation factor (Df) of the dielectric substrate (i.e., composite resin). Transmission loss can be reduced when one or both of Dk and Df of the composite resin are lowered. Therefore, in many applications, it is critical to choose a dielectric substrate having both a low dielectric constant and low dissipation factor in order to provide the signal transmission speeds required for state-of-the-art information processing.

Lowering the dielectric dissipation factor can have a substantial effect on the performance of printed circuit boards in high speed applications. Thus, manufacturers of, e.g., high quality internet servers and RF boards require dielectric substrates made of composite resins with a Df (i.e., loss tangent) of 0.006 or less, preferably 0.005 or less, at 10 GHz. This property allows for the fabrication of printed circuit boards that can be used for, e.g., high-frequency radio antennas and high end server applications. Additionally, manufacturers of broadband devices desire a substrate with a loss tangent that is unchanged over a wide frequency range. Accordingly, it is desirable to provide a composite resin that not only has a low loss tangent at 10 GHz, but that also has a similarly low and relatively constant loss tangent at lower frequencies, e.g., 5 GHz and 1 GHz.

Moreover, the standards imposed on the dielectric substrate employed in printed circuit boards are stringent. Ideally, the composite materials provide both excellent electrical and excellent mechanical properties. Suitable materials must be strong, easy to handle, and have a minimum of defects on the scale of several microns or less. It is also required that they have robust thermal stability, good processability, high peel strength, good moisture resistance, and UL-94 V0 flame resistance.

Various types of materials are known to exhibit low dielectric constants, including thermoplastic resins such as polyolefins, vinyl chloride resins, fluorine resins, syndiotactic polystyrene and aromatic polyester resins, as well as unsaturated polyester resins, polyimide resins, epoxy resins, bismaleimide-triazine resins (BT resins), polyphenylene ether resins (PPE) and crosslinking PPE resins, polyvinylbenzyl ether resins, benzocyclobutene resins and the like. However, when employed alone, these resins are not suited for use in electronic components intended for operation with high-frequency electromagnetic waves because it is difficult to achieve a dielectric dissipation factor of 0.006 or less (at 10 GHz), while satisfying all of the electrical and mechanical properties required for electronic components, such as heat resistance, chemical resistance, insulation, low dielectric loss tangent and low moisture absorption.

Thus, it is an object of the present invention to provide thermosetting resin compositions having a low dielectric constant (Dk) and a low loss tangent (Df), for use in the manufacture of, e.g., prepregs and printed circuit boards, and in the manufacture of radomes (a dielectric housing for antennas used in aerospace applications). It is a further object of the present invention to provide thermosetting resin compositions suitable for components intended for use in high-speed state-of-the-art electronic devices, and which possess robust thermal stability, good processability, high peel strength, good moisture resistance, a high $T_g$ and UL-94 V0 flame resistance.

SUMMARY OF THE INVENTION

The novel thermosetting resin compositions of the present invention include:

A thermosetting resin composition for high-frequency electronic and electric parts and radomes, comprising a cyanate ester polymer and a condensed phosphate ester, wherein the composition has a dielectric dissipation factor (Df) of about 0.006 or less at 10 GHz, and optionally, a dielectric dissipation factor (Df) of about 0.006 or less at 1 GHz.

The thermosetting resin compositions of the present invention further include:

A thermosetting resin composition for high-frequency electronic and electric parts, comprising a cyanate ester polymer and a condensed phosphate ester, wherein the dielectric dissipation factor is substantially unchanged over a frequency range of, for example, about 1 GHz to about 10 GHz. Preferably, the difference between the Df at 1 GHz and the Df at 10 GHz is 20% percent or less, e.g., when the Df is in the range of 0.005.

The thermosetting resin compositions of the present invention further include:

A thermosetting resin composition for high-frequency electronic and electric parts, comprising a cyanate ester polymer, an epoxide polymer, a styrene-maleic anhydride copolymer and a condensed phosphate ester.

The novel thermosetting resin compositions of the present invention possess one or more, and preferably all of the following attributes: high thermal stability, good processability, high peel strength, good moisture resistance, a high $T_g$ and UL-94 V-0 flame resistance. The novel thermosetting resin compositions of the present invention preferably have a dielectric constant (Dk) below 4.0 and a dissipation factor (Df) below 0.005, while providing UL V-1 or V-0 flame retardancy, high thermal stability, good moisture resistance, and high peel strength, a glass transition temperature ($T_g$) above 200° C. when tested with a Dynamic Mechanical Analyzer, and have a low halogen content and are preferably, halogen-free.

Other embodiments of the present invention are a cured resin, a sheet-like cured resin, a laminated body, a prepreg, electronic parts, and single and multilayer circuit boards comprising the novel thermosetting resins of the present invention.

DETAILED DESCRIPTION OF THE INVENTION

In some embodiments, the present invention is directed to a thermosetting resin composition having a low dielectric constant (Dk), a low dielectric dissipation factor (Df), and excellent mechanical properties, including high thermal stability, good processability, high peel strength, good moisture resistance, a high $T_g$ and UL-94 V0 flame resistance. In attempting to achieve the objects of the present invention, the inventors discovered that, when a thermosetting resin is made with a cyanate ester polymer in combination with a condensed phosphate ester flame retardant, such as resorcinol bis-(di-2,6-dimethylphenylphosphate), a remarkable reduction in dielectric dissipation factor is achieved, while maintaining excellent electric and mechanical properties. This reduction in Df was not observed in thermosetting resins containing a cyanate ester polymer that did not include a flame retardant, or compositions comprising a thermosetting resin compositions containing a cyanate ester polymer and other flame retardant compositions well known in the art. The novel thermosetting resin composition as a whole exhibits a low dielectric constant and low dielectric dissipation in the gigahertz range (i.e., 1-10 GHz). Thus, the present inventors have surprisingly found that thermosetting resins suitable for use in high-frequency electronic applications can be provided by adding a condensed phosphate ester to a composition containing a cyanate ester resin. By adding a condensed phosphate ester to the cyanate ester resin composition, a thermosetting resin is also provided that meets the rigorous industrial standards required for printed circuit boards.

DEFINITIONS

The term "thermosetting polymer resin," as used herein, refers to a resin that is cured, set or hardened into a permanent shape. Curing is an irreversible chemical reaction typically involving molecular cross-linking using heat or irradiation (e.g., UV irradiation). Curing of thermosetting materials can be initiated or completed at, for example, ambient or higher temperatures. The cross-linking that occurs in the curing reaction is brought about by the linking of atoms between monomers or across two linear polymers, resulting in a three-dimensional rigidified chemical structure. Included in the scope of "thermosetting resins" of the invention are mixtures comprising a cyanate ester resin and a condensed phosphate ester in the form of, for example, a varnish, a pre-cured resin, a cured resin, a sheet-like cured resin, a resin comprising a base material, e.g., a woven or non-woven fabric, and a resin that is part of a laminated body, a prepreg, an electronic part, or a single or multilayer circuit board.

The term "cyanate ester resin" as used herein refers to polymeric networks prepared by thermal polymerization of cyanate ester monomers containing two or more cyanate ester (—OCN) functional groups. Cyanate ester resins of the present invention include, for example, cyanate ester monomers and prepolymers (i.e., partially polymerized cyanate ester monomers or blends of cyanate ester monomers), and homopolymers and copolymers made using cyanate ester precursors, and mixtures of these compounds.

As used herein, the term "epoxy resin" embraces any thermoset polymer containing one or more epoxide groups, optionally curable by, for example, reaction with amines, alcohols, phenols, carboxylic acids and acid anhydrides.

The terms "dielectric dissipation factor (Df)" and "loss tangent," as used herein, are synonymous and refer to the amount of energy dissipated (i.e., electrical loss) into an insulating material when a voltage is applied to the circuit. Df represents the loss of the signal in the circuit.

The terms "dielectric constant (Dk)" and "permitivity," as used herein, are synonymous and refer to a measurement of the relative capacitance of an insulating material to that of air or vacuum. The dielectric constant determines the speed of the electronic signal.

The term "peel strength" refers to the force required to separate the ultra-thin copper foil from a substrate to which it has been laminated.

The term "glass transition temperature" or "$T_g$," as used herein, means the temperature at which the amorphous domains of a polymer take on the characteristic properties of the glass state-brittleness, stiffness, and rigidity. The term further means the temperature at which cured resins undergo a change from a glassy state to a softer more rubbery state. Moreover, the term refers to, among other things, the approximate midpoint of the temperature range over which the glass transition takes place. $T_g$ may alternatively be determined as described by Fox in Bull. Amer. Physics. Soc., 1, 3, page 123 (1956).

The cyanate ester resins that are useful in the novel resin compositions of the present invention are not limited, and any resin composed of cyanate ester monomers, which polymerize to form a polymer containing a plurality of cyanate ester (—OCN) functional groups may be used in practicing the invention. Cyanate ester monomers and prepolymers (i.e., partially polymerized cyanate ester monomers or blends of cyanate ester monomers) may be prepared according to methods well known to those in skill in the art, for example, those disclosed in "Chemistry and Technology of Cyanate Ester Resins", by Ian Hamerton, Blackie Academic and Professional; U.S. Pat. No. 3,553,244, and JP-A-7-53497. Suitable cyanate ester resins include, for example, 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, cyanate ester resins prepared from dicyclopentadiene-phenol copolymers, and prepolymers prepared from these monomers. An example of a preferred prepolymer is PRIMASET® BA-230S (Lonza). The cyanate ester prepolymers can be homopolymers, or can be copolymers that incorporate other monomers not containing cyanate ester functionality. Examples of such copolymers include, but are not limited to, BT resins available from Mitsubishi Gas Chemical, such as, BT 2160 and BT2170, which are prepolymers made with cyanate ester monomers and bismaleimide monomers. Also suitable are PRIMASET® PT resins (Lonza) and other cyanate ester resin prepolymers made from phenolic novolac type compounds, such as, PT-15, PT-30, and PT-60. Other examples of cyanate esters polymers, monomers, prepolymers, and blends of cyanate ester monomers with other non-cyanate ester monomers that are suitable for use in the present invention include those disclosed in, for example, U.S. Pat. Nos. 7,393,904, 7,388,057, 7,276,563, and 7,192,651, assigned to Mitsubishi Gas and Chemical; the disclosures of which are incorporated by reference herein in their entireties. All monomers, prepolymers and partially polymerized cyanate esters may be used either individually or in combination.

Preferably, the cyanate ester resin is a homopolymer of cyanate ester monomers, prepolymers, and partially polymerized cyanate esters containing a bisphenol fragment, e.g., bisphenol A, bisphenol F, etc. In a preferred embodiment, the cyanate ester resin is a prepolymer of 2,2-bis(4-cyanatophenyl)propane.

The condensed phosphate esters that are that are useful in the novel resin compositions of the present invention are not limited. Included are condensed phosphate esters of Formula (I):

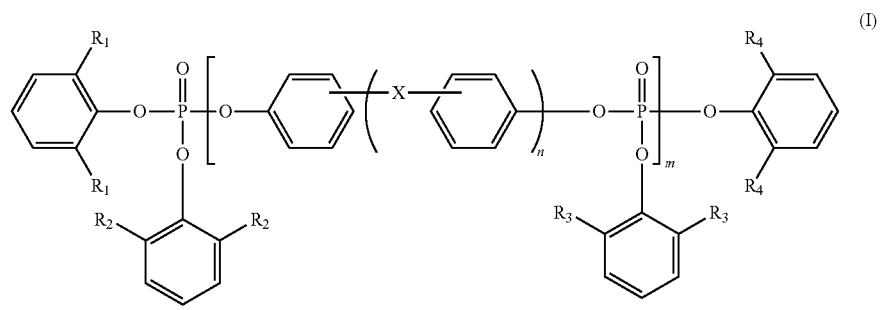

wherein
$R^1$ to $R^4$ are independently selected from a hydrogen atom, an alkyl or cycloalkyl group; X is a bond, —CH$_2$—, —C(CH$_3$)$_2$—, —S—, —SO$_2$—, —O—, —CO— or —N=N—; n is an integer of 0, 1, or 2; and m is an integer of 0 to 5.

As illustrated, compounds of formula (I) may comprise a bifunctional phenol residue. As the bifunctional phenol residue, resorcinol, hydroquinone, 4, 4-biphenol, bisphenol A, bisphenol F and bisphenol S are preferred.

Preferred compounds of formula (I) are those wherein the R groups are alkyl groups. Even more preferred are compounds of formula (I) wherein the $R^1$ to $R^4$ groups are methyl. Especially preferred condensed phosphate esters are resorcinol bis-(di-2,6-dimethylphenylphosphate) (also known as resorcinol bis-(dixylenylphosphate (RDX), resorcinol bis-(diphenylphosphate) (RDP), Bisphenol A bis(diphenylphosphate) BDP, and 4,4'-biphenol bis-(di-2,6-dimethylphenylphosphate). 4,4'-biphenyl bis-(di-2,6-dimethylphenylphosphate) (PX-202®) and resorcinol bis-(di-2,6-dimethylphenylphosphate) (PX-200®) are highly preferred. Examples of aromatic phosphates of the general formula (I) also include compounds having the following formulas (1) to (8), among which compounds (1) and (3) are preferred.

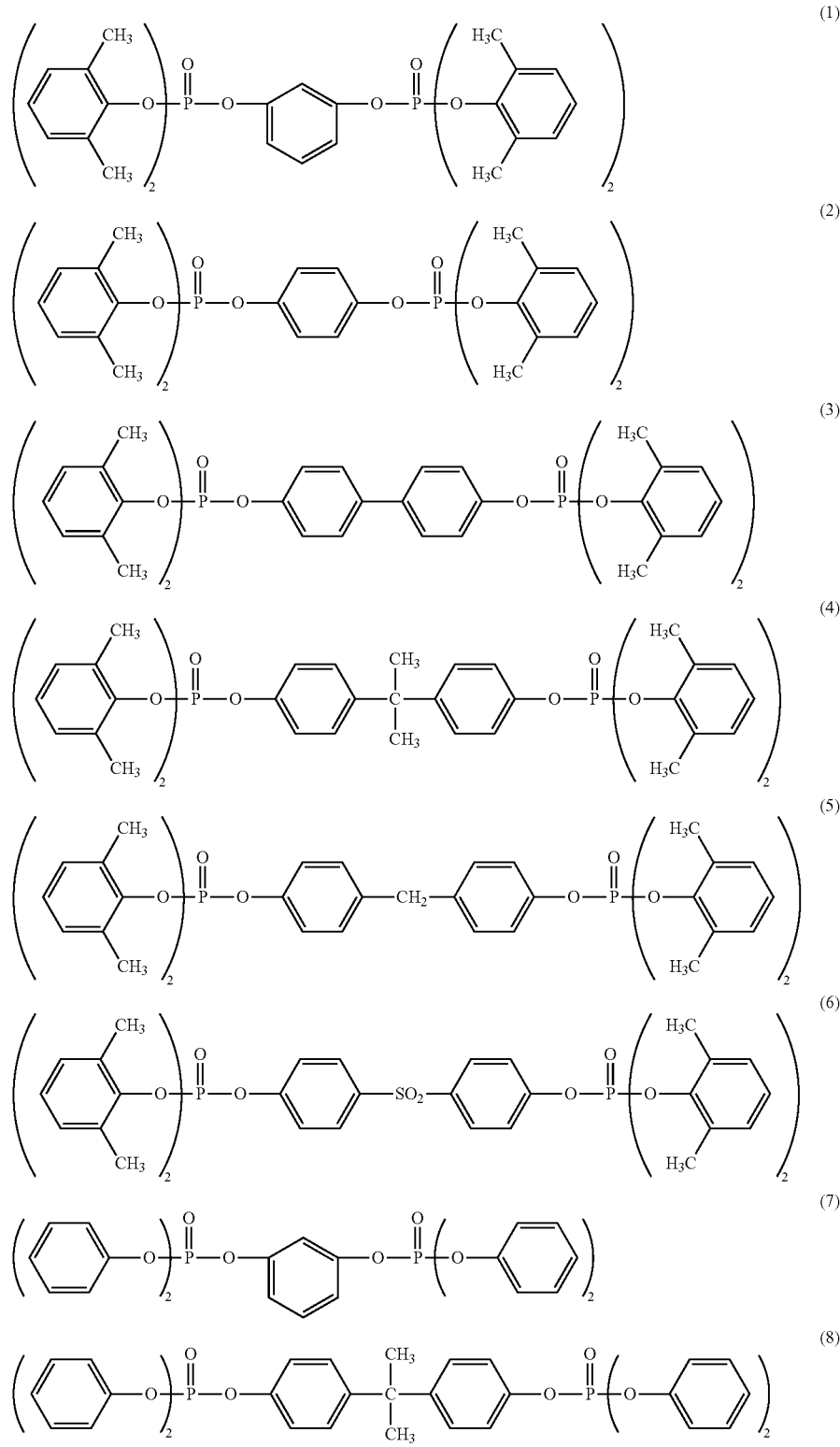

Other preferred condensed phosphate esters, and methods for synthesizing the compounds, are disclosed in U.S. Pat. No. 6,462,112, hereby incorporated by reference in its entirety.

The thermosetting resin compositions of the present invention contain from about 1 to about 99 percent by weight of the cyanate ester resin, and from about 1 to about 99 percent by weight of the condensed phosphate ester, preferably, resorcinol bis-(di-2,6-dimethylphenylphosphate). Preferably, the cyanate ester resin is present between about 30 and about 95 percent by weight, and the condensed phosphate ester, preferably, resorcinol bis-(di-2,6-dimethylphenylphosphate) is present in between about 0 to about 30 by weight. More preferably, the cyanate ester resin is present between about 40 and about 90 percent by weight, and the condensed phosphate ester, preferably, resorcinol bis-(di-2,6-dimethylphenylphosphate) is present in between about 5 and about 30 by weight. Even more preferably, the cyanate ester resin is present between about 30 and about 40 percent by weight, and the condensed phosphate ester, preferably, resorcinol bis-(di-2,6-dimethylphenylphosphate) is present in between about 15 and about 20 by weight. In an alternative embodiment, the cyanate ester resin is present between about 70 and about 90 percent by weight, and the condensed phosphate ester, preferably, resorcinol bis-(di-2,6-dimethylphenylphosphate) is present in between about 10 and about 30 by weight. In yet another alternative embodiment, the cyanate ester resin is present between about 25 to about 50 percent by weight, and the condensed phosphate ester, preferably, resorcinol bis-(di-2,6-dimethylphenylphosphate) is present in between about 10 to about 30 by weight.

In another embodiment, the thermosetting resin compositions of the present invention may optionally contain an epoxy resin. Although the epoxy resin is not a necessary component in the thermosetting resins of the present invention, a variety of epoxy resins can be included without compromising the electrical properties (e.g., Dk and Df) and mechanical properties of the composition. Thus, an epoxy resin may be employed in combination with the cyanate ester resin and the condensed phosphate ester if it is desired, e.g., to reduce the overall cost of production for the thermosetting resin composition.

The term "epoxy resin" in this context refers to a curable composition of oxirane ring-containing compounds as described in, for example, C. A. May, Epoxy Resins, 2.sup.nd Edition, (New York & Basle: Marcel Dekker Inc.), 1988. The epoxy resins that are suitable for use in the present invention include, but are not limited to, bisphenol A type epoxy resins such as those obtained from bisphenol A and resins obtained by substituting at least one position of the 2-position, the 3-position and the 5-position of bisphenol A with a halogen atom, an alkyl group having 6 or less carbon atoms or a phenyl group; bisphenol F type epoxy resins such as those obtained from bisphenol F and a resin obtained by substituting at least one position of the 2-position, the 3-position and the 5-position of bisphenol F with a halogen atom, an alkyl group having 6 or less carbon atoms or a phenyl group; glycidyl ether compounds derived from bivalent or tri- or more-valent phenols such as hydroquinon, resorcin, tris-4-(hydroxyphenyl)methane and 1,1,2,2-tetrakis(4-hydroxyphenyl)ethane; a novolak type epoxy resin derived from a novolak resin which is a reaction product between phenols such as phenol and o-cresol and formaldehyde, including bisphenol A novolak type epoxy resins and cresol novolak type epoxy resins; cyclic aliphatic epoxy compounds such as 2,2-bis(3,4-epoxycyclohexyl)propane, 2,2-bis[4-(2,3-epoxypropyl)cyclohexyl]propane, vinylcyclohexenedioxide, 3,4-epoxycyclohexylmethyl-3,4-epoxycyclohexane carboxylate; dicyclopentadiene-containing polyepoxides; amine type epoxy resins derived from aniline, p-aminophenol, m-aminophenol, 4-amino-m-cresol, 6-amino-m-cresol, 4,4'-diaminodiphenylmethane, 3,3'-diaminodiphenylmethane, 4,4'-diaminodiphenylether, 3,4'-diaminodiphenylether, 1,4-bis(4-aminophenoxy)benzene, 1,4-bis(3-aminophenoxy)benzene, 1,3-bis(4-aminophenoxy)benzene, 1,3-bis(3-aminophenoxy)benzene, 2,2-bis(4-aminophenoxyphenyl)propane, p-phenylenediamine, m-phenylenediamine, 2,4-toluenediamine, 2,6-toluenediamine, p-xylylenediamine, m-xylylenediamine, 1,4-cyclohexane-bis(methylamine), 5-amino-1-(4'-aminophenyl)-1,3,3-trimethylindane, 6-amino-1-(4'-aminophenyl)-1,3,3-trimethylindane and the like; heterocyclic epoxy compounds, and glycidyl ester type epoxy compounds, for example, those derived from glycidyl ester of aromatic carboxylic acids such as p-oxybenzoic acid, m-oxybenzoic acid, terephthalic acid and isophthalic acid.

The term "epoxy resin" also stands for reaction products of compounds containing an excess of epoxy groups (for instance, of the aforementioned types) and aromatic dihydroxy compounds. These compounds may be halogen substituted and may be used alone or in combination.

In a preferred embodiment, the epoxy resins that are optionally present in the thermosetting resin compositions of the present invention are dicyclopentadiene-containing polyepoxides, bisphenol A type epoxy resins, and bisphenol F type epoxy resins. More preferably, the epoxy resin is a dicyclopentadiene-containing polyepoxide. Even more preferably, the epoxy resin is Huntsman Tactix 556 or 756® or Nippon Kayaku XD-1000® or a DIC HP-7200 series resin.

When the thermosetting resin compositions of the present invention contain one or more epoxy resins, the one or more epoxy resins are present in between about 0 and about 30 percent by weight, preferably between about 0 and about 20 percent by weight, even more preferably from about 0 and about 15 percent by weight.

Cross-linking of the epoxy resin generally proceeds with the aid of an epoxy curing agent or accelerator. Epoxy curing agents could include, but are not limited to, amines, phenols and anhydrides, including SMA type anhydrides. As suitable accelerators may be mentioned imidazoles, more particularly alkyl substituted imidazoles such as 2-methylimidazole and 2-ethyl-4-methylimidazole, and tertiary amines, e.g. benzyldimethylamine.

The thermosetting resin composition of the present invention may optionally contain one or more copolymers derived from at least one monomer selected from the group consisting of maleic anhydride, acrylonitrile, acrylic acid, ethyl acrylate, butyl acrylate, glycidyl acrylate, butadiene, ethyl methacrylate, butyl methacrylate and styrene. As mentioned above, the copolymers may also contain a cyanate ester monomer, or prepolymer.

Preferred copolymers for use in the present invention are those composed of styrene and maleic anhydride (SMAs), including SMA epoxy curatives. Although not necessary in the thermosetting resins of the present invention, a variety of styrene-maleic anhydride polymers can be incorporated without compromising the electrical properties (e.g., Dk and Df) and mechanical properties of the composition. Copolymers of styrene and maleic anhydride have been described, inter alia, in Encyclopedia of Polymer Science and Engineering Vol. 9 (1987), page 225. Within the framework of the invention the term "copolymer" likewise refers to SMA or mixtures of SMA.

Copolymers of styrene and maleic anhydrides (SMA) are commercially available in two types. The type 1 SMA copolymers, which have a molecular weight in the range of about 1400 to about 50,000 and an anhydride content of more than 15% by weight, are preferable for use in the resins of the invention. Specific preference is also given to low molecular weight SMA copolymers, e.g., those having a molecular weight of from about 500 to about 5000. Examples of such copolymers include, but are not limited to, the commercially available SMA 1000, SMA 2000, SMA 3000, and SMA 4000, and also SMA EF30, EF40, EF60, and EF80. These copolymers have a styrene:maleic anhydride ratio of 1:1, 2:1, 3:1, and 4:1, 6:1, 8:1 respectively, and a molecular weight ranging from about 1400 to about 2000. Mixtures of these SMA polymers may also be used in practicing the present invention. In a preferred embodiment of the thermosetting resins of the present invention, the SMA is Cray Valley SMA EF40 or Polyscope XIRAN® SMA.

When the thermosetting resin compositions of the present invention contain one or more SMAs, the one or more SMAs are present in between about 0 and about 30 percent by weight, preferably between about 0 and about 25 percent by weight, even more preferably from about 0 and about 20 percent by weight.

Other copolymers that are suitable in the practice of the present invention include, but are not limited to butadiene-acrylonitrile polymers, such as CTBN or ATBN carboxyl or amine-terminated butadiene-acrylonitrile polymers (e.g., CTBN 1300×13, CTBN 1300×8) and their reaction products with an epoxy resin (e.g., Epon 58005); low to high molecular weight PPE oligomers or polymers, with or without reactive ends such as OPE resins, available from Mitsubishi Gas Chemical, and MX90 or MX9000 available from Sabic. In one preferred embodiment, the thermosetting resin composition comprises PPE oligomers or polymers in an amount between about 0 and about 50% by weight, or between about 5 and about 40% by weight, preferably between about 10 and about 30% by weight.

The thermosetting resin composition of the present invention may also include an inorganic filler material. Any inorganic filler known to those of skill in the art can be used without any specific limitation, and can be selected according to the purpose of use. Inorganic filler materials that may be incorporated in the thermosetting resin compositions of the invention, including, for example, inorganic hydrates such as aluminum hydroxide, magnesium hydroxide, zeolite and hydrotalcite; typically used inorganic fillers such as clay, talc, wallastonite, mica, calcium carbonate, magnesium carbonate; alumina, silica and glass powder; B- or Sn-based fillers such as zinc borate, zinc stannate and zinc hydroxystannate; metal oxides such as zinc oxide and tin oxide; inorganic phosphorous materials such as red phosphorous, and organo phosphorous salts. In addition, the inorganic filler is preferably coated or surface treated with a silane coupling agent, a titanate coupling agent or zinc molybdenate or the like to improve adhesion with organic components, heat and moisture resistance, as well as safety of handling.

In one preferred embodiment of the invention, the inorganic filler is present in the thermosetting resin composition in an amount greater than 30%, or from about 0 to about 50% by weight. The thermosetting resin composition preferably contains between about 10 and about 40%, or between about 20 and about 40%, or between about 25 and about 35% by weight inorganic filler.

The thermosetting resin composition of the present invention may also include a cyanate ester cure accelerator. Examples of cyanate ester cure accelerators include, but are not limited to acetylacetonates, such as those of iron, cobalt, or copper; and octoates, such as those of zinc, chromium and manganese.

In addition to the components discussed above, colorants, antioxidants, ultraviolet blockers, thixotropic agents, fluidity control agents, stabilizers and so forth may also be formulated into the thermosetting resin compositions as required and dependent upon the intended end use of the circuit boards that may be made using the thermosetting resins of the present invention.

The thermosetting resin compositions are suitable for use in circuit boards that are employed in high-frequency electronic and electric components that are designed for use in, e.g., telecommunication devices utilizing radio waves, such as mobile phones, wireless LAN (Local Area Network), and GPS (Global Positioning Systems). To meet the design requirements for such applications, in some embodiments, the resin compositions of the invention comprising a cyanate ester polymer and a condensed phosphate ester have a dielectric dissipation factor (Df) of about 0.006 or less at 10 GHz, and optionally, a dielectric dissipation factor (Df) of about 0.006 or less at 1 GHz. When the thermosetting resin of the present invention is prepared in the absence of the base material, the resin preferably has a dielectric dissipation factor (Df) of about 0.005 or less at 10 GHz, and optionally, a dielectric dissipation factor (Df) of about 0.005 or less at 1 GHz, more preferably, a dielectric dissipation factor (Df) of about 0.004 or less at 10 GHz, and optionally, a dielectric dissipation factor (Df) of about 0.004 or less at 1 GHz, even more preferably, a dielectric dissipation factor (Df) of about 0.003 or less at 10 GHz, and optionally, a dielectric dissipation factor (Df) of about 0.003 or less at 1 GHz. In some embodiments, the dielectric dissipation factor (Df) is greater when the resin composition is a composite with a base material, e.g., E glass fibers.

Preferably, the dielectric dissipation factor (Df) is about 0.005 or less at 10 GHz, and optionally, about 0.005 or less at 1 GHz. Even more preferably, the dielectric dissipation factor (Df) is about 0.004 or less at 10 GHz, and optionally, about 0.004 or less at 1 GHz. Typically, the dielectric dissipation factor (Df) of thermosetting resin compositions of the invention is between about 0.001 to about 0.006, preferably between about 0.002 to about 0.005, and even more preferably between about 0.002 to about 0.004 at 10 GHz.

In some embodiments, the thermosetting resin compositions of the present invention have a dielectric dissipation factor (Df) that is flat over a wide frequency range, such that a component fabricated therefrom can operate efficiently at several different processing speeds. This is important because many state of the art electronic devices can operate over a range of frequencies and it is therefore desired that the electronic components maintain proper function throughout this frequency range. For many high-frequency applications, it is desirable to provide a composite resin that not only has a low dielectric dissipation factor (Df) at 10 GHz, but that also has a similarly low and relatively constant loss tangent at, e.g., 5 GHz and 1 GHz. Thus, in these embodiments, the thermosetting resin compositions have a dielectric dissipation factor (Df) of about 0.006 or less at 10 GHz, and a dielectric dissipation factor (Df) of about 0.006 or less at 1 GHz, wherein the difference between the Df at 10 GHz and the Df at 1 GHz is 20% percent or less. Preferably, the thermosetting resin compositions have a dielectric dissipation factor (Df) of 0.005 or less at 10 GHz, and a dielectric dissipation factor (Df) of about 0.005 or less at 1 GHz, wherein the difference between the Df at 10 GHz and the Df at 1 GHz is 18% percent or less. Even more preferably, the thermosetting resin compositions have a dielectric dissipation factor (Df) of 0.004 or less at 10 GHz, and a dielectric dissipation factor (Df) of about 0.004 or less at 1 GHz, wherein the difference between the Df at 10 GHz and the Df at 1 GHz is 15% percent or less. In a most preferred embodiment, the difference between the Df is 10% percent or less throughout the frequency spectrum of from about 1 GHz to about 10 GHz. The thermosetting resin compositions of the present invention have a dielectric constant (Dk) of from about 3 to about 5, preferably from about 3 to about 4.

In some embodiments, the thermosetting resin compositions of the present invention have a $T_g$ when tested using a Dynamic Mechanical Analyzer of from about 150° C. to about 250° C. or 180° C. to about 250° C., preferably from about 190° C. to about 250° C., and even more preferably from about 200° C. to about 250° C.

In some embodiments of the present invention, an organic solvent is employed in preparing the thermosetting resin compositions resins according to the invention. In these embodiments, the thermosetting resin composition is prepared by first preparing a varnish in which the components have been dissolved or dispersed in the organic solvent. The organic solvent should be sufficiently volatile to evaporate before or during the curing of the resin. Suitable solvents for use in practicing the present invention include, but are not limited to, dimethylformamide; glycol ethers such as ethylene glycol mono-ethyl ether or propylene glycol mono-ethyl ether and their esters such as ethylene glycol mono-ethyl ether acetate; ketones such as methyl isobutyl ketone, methyl ethyl ketone, acetone, and methyl isopropyl ketone and cyclohexanone or cyclopentanone; and aromatic hydrocarbons such as toluene and xylene. Alternatively, mixtures of solvents can be employed. In some embodiments, the organic solvent is a mixture of DMF and MEK.

In some embodiments, the invention further pertains to laminates for use in the electronics industry incorporating the thermosetting resins of the present invention. Laminates for use in the electronics industry (particularly for printed wiring or circuit boards) are generally produced by impregnating a supporting or reinforcing material (usually based on glass fibers, either as a woven or nonwoven fabric or in the form of a cross-ply laminate of unidirectionally oriented parallel filaments) with a resin, followed by the resin being cured wholly or in part. The latter process is the most common one, and a fabric impregnated with a partially cured resin is usually referred to as a "prepreg." To make a printed wiring board from a prepreg fabric one or more layers of the prepreg are laminated with, for example, one or more layers of copper. In some embodiments, laminates including the thermosetting resin compositions of the present invention have a copper peel strength of at least 0.7 Kg/cm, preferably greater than 0.8 Kg/cm, and even more preferably greater than 1.0 Kg/cm.

As the base material of woven fabric or non-woven fabric used in the prepreg of the present invention, there may be used natural fiber base materials such as paper or cotton linter; organic synthetic fiber base materials such as Aramid, polyvinyl alcohol, polyester or acrylic fiber, and inorganic fiber base materials such as glass and asbestos. A glass fiber base material is preferable from the viewpoint of flame resistance. Examples of the glass fiber base materials include, but are not limited to, woven fabric using E glass, NE glass (from Nittobo, Japan), C glass, D glass, S glass or Quartz glass, glass non-woven fabric in which short fibers are adhered into a sheet-like material with an organic binder, and further those in which glass fiber and other fiber types are mixed and made fabric. This application preferably calls for the resin to be employed in combination with E glass and/or NE glass woven or non-woven fabrics.

According to the present invention, a prepreg can be produced by impregnating the above varnish into a base material such as a woven fabric or non-woven fabric followed by drying. The resulting prepreg may be laminated with one or more layers as necessary to make a composite structure, and after application of a metal foil such as copper foil or aluminum foil to both surfaces of the structure, is subjected to pressurization and hot pressing to obtain a metal clad laminated board.

According to the present invention, a printed wiring board can be obtained by performing circuit processing on the metal foil of the metal foil clad laminated board. Circuit processing can be carried out by, for example, forming a resist pattern on the surface of the metal foil, removing unnecessary portions of the foil by etching, removing the resist pattern, forming the required through holes by drilling, again forming the resist pattern, plating to connect the through holes, and finally removing the resist pattern. A multi-layer printed wiring board can be obtained by additionally laminating the above metal foil clad laminated board on the surface of the printed wiring board obtained in the above manner under the same conditions as described above, followed by performing circuit processing in the same manner as described above. In this case, it is not always necessary to form through holes, and via holes may be formed in their place, or both may be formed. These laminated boards are then laminated the required number of times.

The printed wiring board produced in the above manner can be laminated with metal foil provided with adhesive on one surface or both surfaces in the form of an inner layer circuit board. This lamination molding is normally performed under heating and pressurization. Examples of metal foil include copper foil and aluminum foil. A multi-layer printed circuit board can then be obtained by performing circuit processing in the same manner as described above on the resulting metal foil clad laminated board.

The following examples serve to more fully describe the manner of using the above-described invention, as well as to exemplify the best modes contemplated for carrying out various aspects of the invention. It is understood that these examples in no way serve to limit the true scope of the invention, but rather are presented for illustrative purposes.

EXAMPLES

The invention will be further illustrated with reference to the following non-limiting examples.

Example 1

63 g dimethylformamide (DMF) was added to a clean mixing vessel. 889 g of a dicyclopentadiene-based cyanate ester resin solution (HF-3S, 75% solids in MEK, Shanghai Huifeng Technical and Business Co., Ltd.) was added and the mixture was mixed until uniform. 333 g of resorcinol bis-(di-2,6-dimethylphenylphosphate) (PX-200®, Daihachi Chemical, phosphorus content 9.0% by weight) was added and the mixture was stirred until this was fully dissolved. 1.2 g of cobalt acetylacetonate curing catalyst was dissolved in a minimum quantity of DMF in a separate container and then added to the mix. The resulting mixture was stirred for 45 minutes. A resin varnish of 78% resin solids was thus prepared.

Comparative Example 1

63 g DMF was added to a clean mixing vessel. 889 g of a dicyclopentadiene-based cyanate ester resin solution (HF-3S, 75% solids in MEK, Shanghai Huifeng Technical and Business Co., Ltd.) was added and the mixture was mixed until uniform. 1.2 g of cobalt acetylacetonate curing catalyst was dissolved in a minimum quantity of DMF in a separate container and then added to the mix. The resulting mixture was stirred for 45 minutes. A resin varnish of 70% resin solids was thus prepared.

Comparative Example 2

63 g DMF was added to a clean mixing vessel. 889 g of a dicyclopentadiene-based cyanate ester resin solution (HF-3S, 75% solids in MEK, Shanghai Huifeng Technical and Business Co., Ltd.) was added and the mixture was mixed until uniform. Then 100 g of a metal phosphinate flame retardant (Exolit® OP930, Clariant, phosphorus content 23.0% by weight) was added and the mixture was stirred until a uniform dispersion was obtained. 1.2 g of cobalt acetylacetonate curing catalyst was dissolved in a minimum quantity of DMF in a separate container and then added to the mix. The resulting mixture was stirred for 45 minutes under high shear to fully disperse the flame retardant. A resin varnish of 73% resin solids was thus prepared.

Comparative Example 3

63 g DMF was added to a clean mixing vessel. 889 g of a dicyclopentadiene-based cyanate ester resin solution (HF-3S, 75% solids in MEK, Shanghai Huifeng Technical and Business Co., Ltd.) was added and the mixture was mixed until uniform. 192 g of a phenoxyphosphazene oligomer flame retardant (Rabitle® FP-100, Fushimi Pharmaceutical Co., Ltd., phosphorus content 13.4% by weight) was then added and the mixture was stirred until this was fully dissolved. 1.2 g of cobalt acetylacetonate curing catalyst was dissolved in a minimum quantity of DMF in a separate container and then added to the mix. The resulting mixture was stirred for 45 minutes. A resin varnish of 75% resin solids was thus prepared.

Comparative Example 4

63 g DMF was added to a clean mixing vessel. 889 g of a dicyclopentadiene-based cyanate ester resin solution (HF-3S, 75% solids in MEK, Shanghai Huifeng Technical and Business Co., Ltd.) was added and the mixture was mixed until uniform. 138 g of poly(1,3-phenylene methyl phosphonate) flame retardant (Fyrol PMP, Supresta LLC, phosphorus content 17.5% by weight) was next added and the mixture was stirred until this was fully dissolved. 1.2 g of cobalt acetylacetonate curing catalyst was dissolved in a minimum quantity of DMF in a separate container and then added to the mix. The resulting mixture was stirred for 45 minutes. A resin varnish of 74% resin solids was thus prepared.

Comparative Example 5

63 g DMF was added to a clean mixing vessel. 889 g of a dicyclopentadiene-based cyanate ester resin solution (HF-3S, 75% solids in MEK, Shanghai Huifeng Technical and Business Co., Ltd.) was added and the mixture was mixed until uniform. Then 77 g of a melamine-microencapsulated ammonium polyphosphate flame retardant (Exolit® AP 462, Clariant, phosphorus content 29.0% by weight) was added and the mixture was stirred until a uniform dispersion was obtained. 1.2 g of cobalt acetylacetonate curing catalyst was dissolved in a minimum quantity of DMF in a separate container and then added to the mix. The resulting mixture was stirred for 45 minutes under high shear to fully disperse the flame retardant. A resin varnish of 72% resin solids was thus prepared.

Example 2

The resin varnishes of Example 1 and Comparative Examples 1-5 were then used to prepare glass fabric prepreg sheets using 7628 and 2116 weave style E-glass fabrics by dipping glass fabric sheets into the resin varnish and passing the impregnated fabric through metering bars to adjust resin content. 7628 weave style fabric with S201 finish and 2216 weave style fabric with S136 finish (Nittobo) were used. These fabric sheets were then dried for 2 to 6 minutes at 185° C. in a mechanical convection oven as required to remove the solvents. Prepreg sheets with nominal resin content of 54% (2116 weave style glass) and 45% (7628 weave style glass) were prepared. A two ply 2116 laminate, a 3 ply 7628 laminate and a 9 ply 7628 laminate were prepared by hot pressing these prepreg stack ups between 1 oz copper foil sheets under vacuum. A curing cycle of 90 minutes at 380° F. and 284 psi was used. Laminate electrical testing (Dk and Df) was carried out on pre-dried specimens using the Split Post Cavity method at 10 GHz. Time to delamination at 300° C. (T300) testing of the copper clad thermosetting resin composition was carried out according to IPC TM-650 2.4.24.1 as provided by IPC at http://www.ipc.org/ContentPage.aspx?pageid=Test-Methods. Flammability class rating (V-0, V-1, or fail) was determined per UL94. The results of these tests are summarized in Table 1.

TABLE 1

| Example No. | Flame Retardant Dosage (3% phosphorous content) | Dk/Df (After baking) (2 × 2116 laminate) | Flammability (3 × 7628 laminate) | T300 (9 × 7628 laminate) |
| --- | --- | --- | --- | --- |
| 1 | 33% | 4.14/0.0041 | V-0 | No delamination after 30 min |
| Comparative 1 | NA | 4.12/0.0061 | Fail | No delamination after 30 min |
| Comparative 2 | 13% | 3.77/0.0057 | V-0 | No delamination after 30 min |
| Comparative 3 | 22% | 4.47/0.0059 | V-0 | No delamination after 30 min |
| Comparative 4 | 17% | — | V1 | No delamination after 30 min |
| Comparative 5 | 10.3% | — | Fail | 10.4 min |

The results depicted in Table 1 establish that the composition of the present invention (Example 1) has improved flammability, Dk and Df values and T300.

Example 3

An exemplary thermosetting composition of the present invention was prepared as follows: 1400 g dimethylformamide (DMF) and 990 g methylethylketone (MEK) were added to a clean mixing vessel. 449 g of a dicyclopentadiene-based epoxy resin (XD-1000, Nippon Kayaku) and 449 g SMA copolymer (SMA EF40, Cray Valley) were added and the mixture was stirred until these were fully dissolved. 3986 g of a cyanate ester prepolymer solution (BA230S, 75% solids in MEK, Lonza) was added and the mixture was mixed until uniform. 281 g phenoxy resin (GZ488V32, Huntsman) was added and the mixture was stirred until uniform. 1794 g of a condensed phosphate ester (PX-200®, Daihachi Chemical) was added and the mixture was stirred until this was fully dissolved. 0.45 g of cobalt acetylacetonate curing catalyst was dissolved in a minimum quantity of DMF in a separate container and then added to the mix. Finally, 2347 g silica powder (SC-2500SEJ, Admatechs) was slowly added to the mix while stirring. The resulting mixture was stirred for 45 minutes under high shear to fully disperse the silica powder. A resin varnish of 69% resin solids was thus prepared.

Example 4

221 g DMF and 221 g MEK were added to a clean mixing vessel. 55 g epoxy resin (XD-1000, Nippon Kayaku) and 55 g SMA copolymer (SMA EF40, Cray Valley) were added and the mixture was stirred until these were fully dissolved. 563 g of a cyanate ester prepolymer solution (BA230S, 75% solids in MEK, Lonza) was added and the mixture was mixed until uniform. 210 g of a condensed phosphate ester (PX-200®, Daihachi Chemical) was added and the mixture was stirred until this was fully dissolved. 0.17 g of cobalt acetylacetonate curing catalyst was dissolved in a minimum quantity of DMF in a separate container and then added to the mix. 110 g flame retardant (OP930, Clariant) was added and the mixture was stirred until a uniform dispersion was obtained. Finally, 364 g silica powder (SC-2500SEJ, Admatechs) was slowly added to the mix while stirring. The resulting mixture was stirred for 45 minutes under high shear to fully disperse the silica powder. A resin varnish of 68% resin solids was thus prepared.

Example 5

216 g DMF and 216 g MEK were added to a clean mixing vessel. 62 g epoxy resin (XD-1000, Nippon Kayaku) and 62 g SMA copolymer (SMA EF40, Cray Valley) were added and the mixture was stirred until these were fully dissolved. 549 g of a cyanate ester prepolymer solution (BA230S, 75% solids in MEK, Lonza) was added and the mixture was mixed until uniform. 39 g phenoxy resin (GZ488V32, Huntsman) was added and the mixture was stirred until uniform. 247 g of a condensed phosphate ester (PX-200®, Daihachi Chemical) was added and the mixture was stirred until this was fully dissolved. 0.16 g of cobalt acetylacetonate curing catalyst was dissolved in a minimum quantity of DMF in a separate container and then added to the mix. 86 g of a brominated flame retardant (Saytex 8010, Albemarle Corp.) was added and the mixture was stirred until a uniform dispersion was obtained. Finally, 323 g silica powder (SC-2500SEJ, Admatechs) was slowly added to the mix while stirring. The resulting mixture was stirred for 45 minutes under high shear to fully disperse the silica powder. A resin varnish of 67% resin solids was thus prepared.

Example 6

210 g DMF and 175 g MEK were added to a clean mixing vessel. 33 g epoxy resin (XD-1000, Nippon Kayaku), 61 g brominated epoxy resin (DER 560, Dow Chemical), and 67 g SMA copolymer (SMA EF40, Cray Valley) were added and the mixture was stirred until these were fully dissolved. 595 g of a cyanate ester prepolymer solution (BA230S, 75% solids in MEK, Lonza) was added and the mixture was mixed until uniform. Then 42 g phenoxy resin (GZ488V32, Huntsman) was added and the mixture was stirred until uniform. 268 g of a condensed phosphate ester (PX-200®, Daihachi Chemical) was added and the mixture was stirred until this was fully dissolved. 0.17 g of cobalt acetylacetonate curing catalyst was dissolved in a minimum quantity of DMF in a separate container and then added to the mix. Finally, 350 g silica powder (SC-2500SEJ, Admatechs) was slowly added to the mix while stirring. The resulting mixture was stirred for 45 minutes under high shear to fully disperse the silica powder. A resin varnish of 69% resin solids was thus prepared.

Example 7

194 g DMF and 194 g MEK were added to a clean mixing vessel. 54 g epoxy resin (XD-1000, Nippon Kayaku) and 54 g SMA copolymer (SMA EF40, Cray Valley) were added and the mixture was stirred until these were fully dissolved. 504 g of a cyanate ester prepolymer solution (BA230S, 75% solids in MEK, Lonza) was added and the mixture was mixed until uniform. 162 g of a phosphorus-containing cyanate ester resin (FR-300, structure undisclosed, Lonza) was added and the mixture was stirred until this resin was fully dissolved. 33 g phenoxy resin (GZ488V32, Huntsman) was added and the mixture was stirred until uniform. 248 g of a condensed phosphate ester (PX-200®, Daihachi Chemical) was added and the mixture was stirred until this was fully dissolved. 0.16 g of cobalt acetylacetonate curing catalyst was dissolved in a minimum quantity of DMF in a separate container and then added to the mix. Finally, 356 g silica powder (SC-2500SEJ, Admatechs) was slowly added to the mix while stirring. The resulting mixture was stirred for 45 minutes under high shear to fully disperse the silica powder. A resin varnish of 70% resin solids was thus prepared.

Example 8

227 g DMF and 227 g MEK were added to a clean mixing vessel. 57 g epoxy resin (Tactix 756, Hunstsman) and 54 g SMA copolymer (SMA EF40, Cray Valley) were added and the mixture was stirred until these were fully dissolved. 584 g of a cyanate ester prepolymer solution (ME240S, 75% solids in MEK, Lonza) was added and the mixture was mixed until uniform. 218 g of a condensed phosphate ester (PX-200®, Daihachi Chemical) was added and the mixture was stirred until this was fully dissolved. Next, 38 g of a brominated aromatic flame retardant (BC-58, Chemtura) was added and the mixture was stirred until this was completely dissolved. 0.28 g of cobalt acetylacetonate curing catalyst was dissolved in a minimum quantity of DMF in a separate container and then added to the mix. 13 g titanium dioxide pigment (Ti-Pure R-900, DuPont) was added and the mixture was stirred until a uniform dispersion was obtained. Finally, 378 g silica powder (SC-2500SEJ, Admatechs) was slowly added to the mix while stirring. The resulting mixture was stirred for 45 minutes under high shear to fully disperse the silica powder. A resin varnish of 67% resin solids was thus prepared.

Example 9

188 g DMF and 188 g MEK were added to a clean mixing vessel. 85 g epoxy resin (Tactix 756, Hunstsman) and 85 g SMA copolymer (SMA EF40, Cray Valley) were added and the mixture was stirred until these were fully dissolved. Next, 57 g of a brominated aromatic flame retardant (BC-58, Chemtura) was added and the mixture was stirred until this was completely dissolved. 871 g of a cyanate ester prepolymer solution (BA230S, 75% solids in MEK, Lonza) was added and the mixture was mixed until uniform. 325 g of a condensed phosphate ester (PX-200®, Daihachi Chemical) was added and the mixture was stirred until this was fully dissolved. 0.42 g of cobalt acetylacetonate curing catalyst was dissolved in a minimum quantity of DMF in a separate container and then added to the mix. The resulting mixture was stirred for 45 minutes under high shear. A resin varnish of 67% resin solids was thus prepared.

Example 10

223 g DMF and 223 g MEK were added to a clean mixing vessel. 3.5 g silane coupling agent (A-187, Momentive) and 381 g silica powder (SC-2500SEJ, Admatechs) were added and mixed under low shear for 4 hours. Next, 36 g of a brominated aromatic flame retardant (BC-58, Chemtura) was added and the mixture was stirred until this was completely dissolved. Then 721 g of a cyanate ester prepolymer solution (BA230S, 75% solids in MEK, Lonza) was added and the mixture was mixed until uniform. 213 g of a condensed phosphate ester (PX-200®, Daihachi Chemical) was added and the mixture was stirred until this was fully dissolved. 0.34 g of cobalt acetylacetonate curing catalyst was dissolved in a minimum quantity of DMF in a separate container and then added to the mix. The resulting mixture was stirred for 45 minutes under high shear. A resin varnish of 65% resin solids was thus prepared.

Example 11

267 g DMF and 267 g MEK were added to a clean mixing vessel. 51 g epoxy resin (Tactix 756, Huntsman) and 51 g SMA copolymer (SMA EF40, Cray Valley) were added and the mixture was stirred until these were fully dissolved. Next, 33 g of a brominated aromatic flame retardant (BC-58, Chemtura) was added and the mixture was stirred until this was completely dissolved. 390 g of a cyanate ester prepolymer solution (BA230S, 75% solids in MEK, Lonza) was added and the mixture was mixed until uniform. 194 g of a condensed phosphate ester (PX-200®, Daihachi Chemical) was added and the mixture was stirred until this was fully dissolved. 0.26 g of cobalt acetylacetonate curing catalyst was dissolved in a minimum quantity of DMF in a separate container and then added to the mix. Finally, 347 g silica powder (SC-2500SEJ, Admatechs) was slowly added to the mix while stirring. The resulting mixture was stirred for 45 minutes under high shear to fully disperse the silica powder. A resin varnish of 67% resin solids was thus prepared.

Example 12

232 g DMF and 232 g MEK were added to a clean mixing vessel. 3.7 g silane coupling agent (A-187, Momentive) and 398 g silica powder (SC-2500SEJ, Admatechs) were added and mixed under low shear for 4 hours. Next, 38 g of a brominated aromatic flame retardant (BC-58, Chemtura) was added and the mixture was stirred until this was completely dissolved. 117 g epoxy resin (Tactix 756, Huntsman) and 117 g SMA copolymer (SMA EF40, Cray Valley) were added and the mixture was stirred until these were fully dissolved. 440 g of a cyanate ester prepolymer solution (BA230S, 75% solids in MEK, Lonza) was added and the mixture was mixed until uniform. Then 222 g of a condensed phosphate ester (PX-200®, Daihachi Chemical) was added and the mixture was stirred until this was fully dissolved. 0.36 g of cobalt acetylacetonate curing catalyst was dissolved in a minimum quantity of DMF in a separate container and then added to the mix. The resulting mixture was stirred for 45 minutes under high shear. A resin varnish of 68% resin solids was thus prepared.

Example 13

300 g cyclohexanone and 300 g MEK were added to a clean mixing vessel. 37 g of a brominated aromatic flame retardant (BC-58, Chemtura) was added and the mixture was stirred until this was completely dissolved. 57 g epoxy resin (Tactix 756, Huntsman) and 57 g SMA copolymer (SMA EF40, Cray Valley) were added and the mixture was stirred until these were fully dissolved. Next, 439 g of a cyanate ester prepolymer solution (BA230S, 75% solids in MEK, Lonza) was added and the mixture was mixed until uniform. 218 g of a condensed phosphate ester flame retardant (BDP, supplied as NCENDX P-30, Albemarle Corp.) was added and the mixture was stirred until this was fully dissolved. 0.29 g of cobalt acetylacetonate curing catalyst was dissolved in a minimum quantity of cyclohexanone in a separate container and then added to the mix. Finally, 391 g silica powder (SC-2500SEJ, Admatechs) was slowly added to the mix while stirring. The resulting mixture was stirred for 45 minutes under high shear to fully disperse the silica powder. A resin varnish of 67% resin solids was thus prepared.

Example 14

334 g cyclohexanone and 334 g MEK were added to a clean mixing vessel. 41 g of a brominated aromatic flame retardant (BC-58, Chemtura) was added and the mixture was stirred until this was completely dissolved. 64 g epoxy resin (Tactix 756, Huntsman) and 64 g SMA copolymer (SMA EF40, Cray Valley) were added and the mixture was stirred until these were fully dissolved. Next, 487 g of a cyanate ester prepolymer solution (BA230S, 75% solids in MEK, Lonza) was added and the mixture was mixed until uniform. 242 g of a condensed phosphate ester (PX-202®, Daihachi Chemical) was added and the mixture was stirred until uniform. 0.29 g of cobalt acetylacetonate curing catalyst was dissolved in a minimum quantity of cyclohexanone in a separate container and then added to the mix. Finally, 434 g silica powder (SC-2500SEJ, Admatechs) was slowly added to the mix while stirring. The resulting mixture was stirred for 45 minutes under high shear to fully disperse the silica powder. A resin varnish of 67% resin solids was thus prepared.

Example 15

233 g cyclohexanone and 233 g MEK were added to a clean mixing vessel. 2.9 g silane coupling agent (A-187, Momentive), 50 g brominated flame retardant (Saytex 8010, Albemarle Corp.), and 316 g silica powder (SC-2500SEJ, Admatechs) were added and mixed under low shear for 4 hours. Next, 243 g PPE oligomer (MX90-100) was added and the mixture was stirred until this was completely dissolved. 46 g epoxy resin (Tactix 756, Huntsman) and 46 g SMA copolymer (SMA EF40, Cray Valley) were added and the mixture was stirred until these were fully dissolved. 389 g of a cyanate ester prepolymer solution (BA230S, 75% solids in MEK, Lonza) was added and the mixture was mixed until uniform. Then 63 g Bisphenol A dicyanate monomer (BadCy, Lonza) was added and the mixture stirred until this was fully dissolved. 176 g of a condensed phosphate ester (PX-200®, Daihachi Chemical) was added and the mixture was stirred until this was fully dissolved. 0.22 g of cobalt acetylacetonate curing catalyst was dissolved in a minimum quantity of DMF in a separate container and then added to the mix. The resulting mixture was stirred for 45 minutes under high shear. A resin varnish of 69% resin solids was thus prepared.

Example 16

The resin varnishes of Examples 3-15 were used to prepare glass fabric prepreg sheets using 7628 and 2116 weave style E-glass fabrics (BGF Industries) by dipping glass fabric sheets into the resin varnish and passing the impregnated fabric through metering bars to adjust resin content. These fabric sheets were then dried for 2 to 6 minutes at 185° C. in a mechanical convection oven as required to remove the solvents. Prepreg sheets with nominal resin content of 54% (2116 weave style glass) and 45% (7628 weave style glass) were prepared. A two ply 2116 laminate and an 8 ply 7628 laminate were prepared by hot pressing these prepreg stack ups between 1 oz copper foil sheets under vacuum. A curing cycle of 125 minutes at 380° F. and 284 psi was used. Laminate electrical testing (Dk and Df) was carried out on specimens (pre-dried and conditioned 24 hours at 50% relative humidity) using the Split Post Cavity method at 10 GHz, as described at http://cp.literature.agilent.com/litweb/pdf/5989-5384EN.pdf, which is incorporated by reference herein in its entirety. Laminate testing of the copper clad thermosetting resin composition was carried out according to industry standards as provided by IPC at http://www.ipc.org/ContentPage.aspx?pageid=Test-Methods. As shown in Table 2, Dynamic Mechanical Analysis (DMA) was used to measure mechanical properties of each sample as a function of time and temperature. Specifically, the storage modulus (E'), loss modulus (E") and damping coefficient (tan delta) glass transition temperature ($T_g$) values were measure as described by the IPC at http://www.ipc.org/ContentPage.aspx?pageid=Test-Methods. Thermomechanical Analysis (TMA) was performed to determine the TMA $T_g$ and Coefficients of Thermal Expansion (CTE) in the z-direction as a function of temperature, as described by the IPC at http://www.ipc.org/ContentPage.aspx?pageid=Test-Methods.

Time to Delamination measurements at 288° C. and 300° C. were also measured as described in the IPC at http://www.ipc.org/ContentPage.aspx?pageid=Test-Methods, which is incorporated herein by reference in its entirety. The results of these tests are summarized in Table 2.

TABLE 2

| Property | Laminate | Test Method | Example No. 3 | 4 | 5 | 6 | 7 | 8 | 9 |
|---|---|---|---|---|---|---|---|---|---|
| Dk at 10 GHz | 2-2116 | Split Post Cavity | 3.9 | 3.9 | 4.1 | 4 | 3.9 | 3.9 | 4.2 |
| Df at 10 GHz | 2-2116 | Split Post Cavity | 0.005 | 0.005 | 0.006 | 0.005 | 0.005 | 0.006 | 0.006 |
| DMA Tg | | | | | | | | | |
| DMA Tg (E'), ° C. | 8-7628 | IPC TM-650 2.4.24.4 | 199 | 184 | 160 | 151 | 190 | N.A. | 177 |
| DMA Tg (E"), ° C. | 8-7628 | IPC TM-650 2.4.24.4 | 208 | 210 | 185 | 186 | 214 | N.A. | 207 |
| DMA Tg (TAN Delta), ° C. | 8-7628 | IPC TM-650 2.4.24.4 | 216 | 219 | 198 | 199 | 222 | N.A. | 214 |
| TMA Tg, ° C. | 8-7628 | IPC TM-650 2.4.24C | 139 | 177 | 153 | 138 | 181 | 130 | 142 |
| TMA z-CTE α1 [50° C.-Tg-5° C.], ppm | 8-7628 | IPC TM-650 2.4.24C | 63 | 66 | 80 | 72 | 52 | 66 | 102 |
| TMA z-CTE α2 [Tg + 5° C.-260° C.], ppm | 8-7628 | IPC TM-650 2.4.24C | 215 | 274 | 245 | 269 | 258 | 276 | 337 |
| TMA z-CTE [50° C.-260° C.], % | 8-7628 | IPC TM-650 2.4.24C | 4.1 | 4 | 4 | 4.6 | 3.6 | 4.1 | 4.7 |
| T288, min. | 8-7628 | IPC TM-650 2.4.24.1 | >30 | >30 | >30 | >30 | >30 | >30 | >30 |
| T300, min. | 8-7628 | IPC TM-650 2.4.24.1 | >30 | 25 | >30 | 21 | >30 | 16 | 16 |
| Copper Peel Strength, lb/in | 8-7628 | IPC TM-650 2.4.8 | 12.4 | 7.2 | 12.1 | 11.6 | 10.3 | 11.2 | 14.1 |
| Flammability (total time), sec. | 8-7628 | IPC TM-650 2.3.10 | 32 | 11 | 9 | 9 | 32 | 18 | 34 |

| Property | Laminate | Test Method | Example No. 10 | 11 | 12 | 13 | 14 | 15 |
|---|---|---|---|---|---|---|---|---|
| Dk at 10 GHz | 2-2116 | Split Post Cavity | 4.1 | 3.9 | 3.9 | 4 | 4 | 4 |
| Df at 10 GHz | 2-2116 | Split Post Cavity | 0.006 | 0.005 | 0.006 | 0.006 | 0.005 | 0.005 |
| DMA Tg | | | | | | | | |
| DMA Tg (E'), ° C. | 8-7628 | IPC TM-650 2.4.24.4 | 138 | 187 | 169 | 144 | 203 | 157 |
| DMA Tg (E"), ° C. | 8-7628 | IPC TM-650 2.4.24.4 | 176 | 201 | 204 | 180 | 229 | 184 |
| DMA Tg (TAN Delta), ° C. | 8-7628 | IPC TM-650 2.4.24.4 | 187 | 210 | 216 | 194 | 237 | 193 |

TABLE 2-continued

| | | | | | | | | |
|---|---|---|---|---|---|---|---|---|
| TMA Tg, ° C. | 8-7628 | IPC TM-650 2.4.24C | 126 | 151 | 151 | 140 | 197 | 139 |
| TMA z-CTE α1 [50° C.-Tg-5° C.], ppm | 8-7628 | IPC TM-650 2.4.24C | 69 | 67 | 83 | 74 | 43 | 44 |
| TMA z-CTE α2 [Tg + 5° C.-260° C.], ppm | 8-7628 | IPC TM-650 2.4.24C | 345 | 283 | 327 | 343 | 300 | 431 |
| TMA z-CTE [50° C.-260° C.], % | 8-7628 | IPC TM-650 2.4.24C | 5.2 | 3.6 | 4.6 | 4.7 | 2.7 | 4.9 |
| T288, min. | 8-7628 | IPC TM-650 2.4.24.1 | >30 | >30 | >30 | 18 | 28 | >30 |
| T300, min. | 8-7628 | IPC TM-650 2.4.24.1 | >30 | 17 | 29 | 9 | 15 | >30 |
| Copper Peel Strength, lb/in | 8-7628 | IPC TM-650 2.4.8 | 9.8 | 12 | 3.8 | 7.6 | 7.8 | 9.6 |
| Flammability (total time), sec. | 8-7628 | IPC TM-650 2.3.10 | 50 | 22 | 16 | 5 | 14 | 5 |

The data in Table 2 establish that compositions of the invention exhibit desirable flammability, copper peel strength, Dk and Df values, and DMA and TMA parameters.

Example 17

In Example 17, the resin varnish prepared in Example 11 was used to prepare glass fabric prepreg sheets using 7628 and 2116 weave style E-glass fabrics (BGF Industries) by dipping glass fabric sheets into resin varnish and passing the impregnated fabric through metering bars to adjust resin content. These fabric sheets were then dried for 2 to 6 minutes at 185° C. in a mechanical convention oven as required to remove the solvents. Prepreg sheets with nominal resin content of 54% (2116 weave style glass) and 45% (7628 weave style glass) were prepared. A two ply 2116 laminate and an eight ply 7628 laminate were prepared by hot pressing these prepreg stack ups between 1 oz copper foil sheets under vacuum. A curing cycle of 125 minutes at 380° C. and 284 psi was used. Laminate electrical testing (Dk and Df) was carried out on specimens using the Split Cavity method described at http://cp.literature.agilent.com/litweb/pdf/5989-5384EN-.pdf, which is incorporated by reference herein in its entirety. The data collected for samples tested at 1 MHz and 1 GHz was generated on dry sample specimens. The data collected at 10 GHz was obtained from specimens that were pre-dried and conditioned for 24 hours at 50% relative humidity.

TABLE 3

| Property | Laminate | Example No. 11 |
|---|---|---|
| Dk (1 MHz) | 8-7628 | 4.15 |
| Df (1 MHz) | 8-7628 | 0.0041 |
| Dk (1 GHz) | 8-7628 | 4.11 |
| Df (1 GHz) | 8-7628 | 0.0042 |
| Dk (10 GHz) | 2-2116 | 3.9 |
| Df (10 GHz) | 2-2116 | 0.005 |

The data in Table 3 demonstrates that the inventive resin provides laminates having low DK and Df properties over the 1 MHz to 10 GHz range resulting in improvements in signal transmission speed over this frequency range.

What is claimed is:

1. A thermosetting resin composition, comprising
a cyanate ester resin; and
a phosphate condensed ester of formula (I):

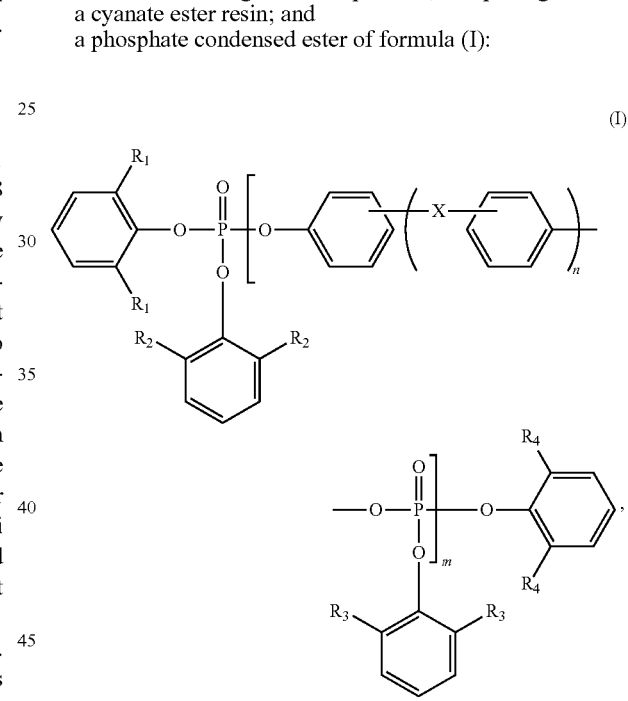

(I)

wherein $R^1$ to $R^4$ are the same or different, a hydrogen atom or an alkyl group having 1 to 3 carbon atoms, excluding the case where $R^1$ to $R^4$ are all hydrogen atoms; X is a bond, —$CH_2$—, —$C(CH_3)_2$—, —S—, —$SO_2$—, —O—, —CO— or —N=N—; n is an integer of 0 or 1; and m is an integer of 0 to 5,
said composition having a dielectric dissipation factor (Df) of about 0.006 or less at 10 GHz.

2. The thermosetting resin composition of claim 1, having a dielectric dissipation factor (Df) of about 0.006 or less at 1 GHz.

3. The thermosetting resin composition of claim 1, having a dielectric dissipation factor (Df) of about 0.005 or less at 10 GHz.

4. The thermosetting resin composition of claim 2, having a difference between the Df at 1 GHz and the Df at 10 GHz of 20% percent or less.

5. The thermosetting resin composition of claim 1, having a dielectric constant (Dk) of 4 or less.

6. The thermosetting resin composition of claim 1, wherein the cyanate ester resin is a monomer or prepolymer of a monomer selected from the group consisting of 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, and α,α'-bis(4-cyanatophenyl)-m-diisopropylbenzene; or a dicyclopentadiene-based cyanate ester resin, a Bismaleimide-Triazine (BT) resin, or a Phenolic-Triazine (PT) resin.

7. The thermosetting resin composition of claim 6, wherein the cyanate ester resin is a homopolymer of 2,2-bis(4-cyanatophenyl)propane.

8. The thermosetting resin composition of claim 1, wherein the cyanate ester resin is present at between about 1 and about 95 percent by weight of said composition, and the phosphate condensed ester is present at between about 5 and about 30 percent by weight of said composition.

9. The thermosetting resin composition of claim 8 wherein the cyanate ester resin is present at between about 30 and about 40 percent by weight of said composition, and the phosphate condensed ester is present at between about 10 and about 30 by weight of said composition.

10. The thermosetting resin composition of claim 9, comprising between about 30 and about 40 percent by weight of the cyanate ester polymer, and between about 15 and about 20 by weight of the phosphate condensed ester.

11. The thermosetting resin composition of claim 1, further comprising one or more epoxy resins.

12. The thermosetting resin of claim 11, wherein the epoxy resin is a member selected from the group consisting of dicyclopentadiene-containing polyepoxides, bisphenol A type epoxy resins, and bisphenol F type epoxy resins.

13. The thermosetting resin of claim 11, comprising between about 0 and about 20 percent by weight of one or more epoxy resins.

14. The thermosetting resin of claim 13, comprising between about 0 to about 15 percent by weight of one or more epoxy resins.

15. The thermosetting resin composition of claim 1, further comprising a copolymer derived from at least one monomer selected from the group consisting of maleic anhydride, acrylonitrile, acrylic acid, ethyl acrylate, butyl acrylate, glycidyl acrylate, butadiene, ethyl methacrylate, butyl methacrylate and styrene.

16. The thermosetting resin composition of claim 15, wherein the copolymer is a styrene maleic anhydride copolymer.

17. The thermosetting resin composition of claim 16, wherein the styrene maleic anhydride copolymer comprises between about 0 and about 25 percent by weight of said composition.

18. The thermosetting resin composition of claim 17, wherein the styrene maleic anhydride copolymer comprises between about 0 and about 20 percent by weight of said composition.

19. The thermosetting resin composition of claim 1, wherein the phosphate condensed ester comprises resorcinol bis-(di-2,6-dimethylphenylphosphate).

20. The thermosetting resin composition of claim 1, wherein the phosphate condensed ester is 4,4'-biphenyl bis-(di-2,6-dimethylphenylphosphate).

21. The thermosetting resin of claim 1, further comprising at least one inorganic filler.

22. The thermosetting resin of claim 21, wherein the inorganic filler is a member selected from inorganic hydrates, inorganic salts, metal oxides, inorganic phosphorus, or organo-phosphorous salts.

23. The thermosetting resin of claim 21, wherein the inorganic filler is surface treated.

24. The thermosetting resin of claim 21, wherein the inorganic filler is silica.

25. The thermosetting resin of claim 24, wherein the silica is present at about 0 to about 50 percent by weight.

26. The thermosetting resin of claim 24, wherein the silica is present at about 25 to about 35 percent by weight.

27. The thermosetting resin of claim 1, further comprising at least one polyphenylene ether oligomer or polymer.

28. The thermosetting resin of claim 27, wherein the polyphenylene ether oligomer or polymer is present at about 5 to about 50 percent by weight.

29. The thermosetting resin of claim 27, wherein the polyphenylene ether oligomer or polymer is present at an amount of about 10 to about 30 percent by weight.

30. The thermosetting resin composition of claim 1, further comprising a base material.

31. The thermosetting resin composition of claim 30, wherein the base material is a woven or non-woven fabric.

32. The thermosetting resin composition of claim 30, wherein the woven or non-woven fabric is a glass.

33. A prepreg comprising the thermosetting resin composition of claim 1.

34. The prepreg of claim 33, wherein the phosphate condensed ester is resorcinol bis-(di-2,6-dimethylphenylphosphate).

35. A printed circuit board comprising the thermosetting resin composition of claim 1.

36. The printed circuit board of claim 35, wherein the phosphate condensed ester is resorcinol bis-(di-2,6-dimethylphenylphosphate).

37. The printed circuit board of claim 35, wherein the phosphate condensed ester is 4,4'-biphenyl bis-(di-2,6-dimethylphenylphosphate).

38. A printed circuit board of claim 35, wherein the circuit board is a multilayer circuit board.

39. The thermosetting resin composition of claim 1, wherein the phosphate condensed ester is Bisphenol A bis-(diphenylphosphate).

40. The thermosetting resin composition of claim 1, having a dielectric dissipation factor (Df) in the range of about 0.001 to about 0.006.

41. A method of making a laminate having a dielectric dissipation factor (Df) of about 0.006 or less at 10 GHz which comprises providing a thermosetting resin comprising a cyanate ester resin and a phosphate condensed ester of formula (I):

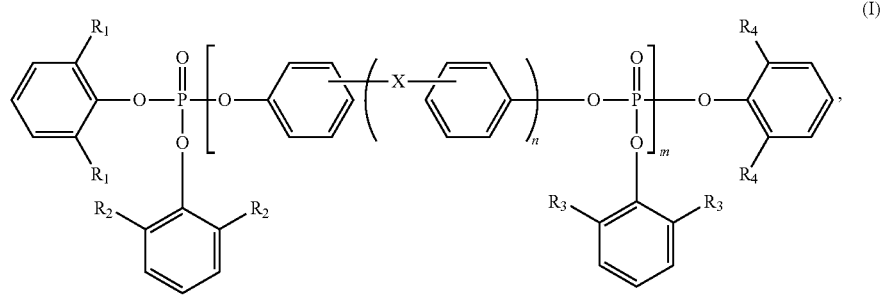

wherein $R^1$ to $R^4$ are the same or different, a hydrogen atom or an alkyl group having 1 to 3 carbon atoms, excluding the case where $R^1$ to $R^4$ are all hydrogen atoms; X is a bond, —$CH_2$—, —$C(CH_3)_2$—, —S—, —$SO_2$—, —O—, —CO— or —N=N—; n is an integer of 0 or 1; and m is an integer of 0 to 5;

impregnating a substrate with said thermosetting resin; and curing said impregnated substrate.

42. The method of claim 41, which comprises laminating a sheet of electronically conductive metal to at least one side of the cured substrate.

43. The method of claim 41, which comprises joining two or more of said impregnated substrates.

44. The method of claim 42, wherein the electronically conductive metal comprises copper.

45. The method of claim 41, wherein the substrate comprises a glass fiber.

\* \* \* \* \*